United States Patent
Zhu et al.

(10) Patent No.: US 9,583,499 B1
(45) Date of Patent: Feb. 28, 2017

(54) DEVICES WITH EMBEDDED NON-VOLATILE MEMORY AND METAL GATES AND METHODS FOR FABRICATING THE SAME

(71) Applicant: GLOBALFOUNDRIES Singapore Pte. Ltd., Singapore (SG)

(72) Inventors: Ming Zhu, Singapore (SG); Pinghui Li, Singapore (SG); Weining Cheng, Singapore (SG); Yiang Aun Nga, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/952,536

(22) Filed: Nov. 25, 2015

(51) Int. Cl.
*H01L 27/115* (2006.01)
*H01L 29/66* (2006.01)
*H01L 21/28* (2006.01)
*H01L 21/3213* (2006.01)
*H01L 21/3105* (2006.01)

(52) U.S. Cl.
CPC .. *H01L 27/11524* (2013.01); *H01L 21/28273* (2013.01); *H01L 21/31051* (2013.01); *H01L 21/32139* (2013.01); *H01L 27/11531* (2013.01); *H01L 29/66545* (2013.01); *H01L 29/66825* (2013.01)

(58) Field of Classification Search
CPC .................................................. H01L 21/28273
USPC .......................................... 257/316; 438/258
See application file for complete search history.

(56) References Cited

U.S. PATENT DOCUMENTS

2014/0008713 A1* 1/2014 Toh .................. H01L 21/28273
257/321

* cited by examiner

*Primary Examiner* — Kenneth Parker
*Assistant Examiner* — Warren H Kilpatrick
(74) *Attorney, Agent, or Firm* — Lorenz & Kopf, LLP (57) ABSTRACT

Devices and methods for fabricating devices with floating gates and replacement metal gates are provided. In an embodiment, a method for fabricating a device includes providing a semiconductor substrate. The method forms a floating gate and a sacrificial gate over the semiconductor substrate. Further, the method replaces the sacrificial gate with a metal gate. After replacing the sacrificial gate with the metal gate, the method forms a control gate over the floating gate.

20 Claims, 9 Drawing Sheets

DEVICES WITH EMBEDDED NON-VOLATILE MEMORY AND METAL GATES AND METHODS FOR FABRICATING THE SAME

TECHNICAL FIELD

The technical field generally relates to embedded non-volatile memory (eNVM), and more particularly relates to devices that include eNVM and metal gates formed with replacement metal gate (RMG) techniques and to methods for fabricating such devices.

BACKGROUND

According to certain approaches in conventional semiconductor processing, gates in embedded non-volatile memory (eNVM) cells and in logic cells may be formed from common polysilicon gate layers. Typically, such processing provides for the deposition of polysilicon gate layers and insulating layers over memory cell areas and logic cell areas. Such layers are then patterned and etched to form stacks of control gates overlying floating gates in memory cell areas and polysilicon access gates in logic cell areas. This approach involves process complexity as the access gate, floating gate and control gate need to be doped. Further, step height differences between the logic cells and memory cells cause contact landing issues. Thus, special processing may be needed for landing contacts on the access gates. Moreover, like most n+ polysilicon control gate/floating gate stacked memory devices, erase saturation level can be a performance issue. The approach used in conventional processing typically necessitates additional process steps, including for example seven to nine additional masks, that increase cost and decrease efficiency of the integration process.

Scaling of devices has suggested the use of replacement metal gate (RMG) techniques in the integrated formation of access gates in logic cells and select gates in memory cells. However, integration of RMG techniques with eNVM cells presents challenges. In certain approaches, applying RMG techniques to existing processes for forming eNVM cells has presented issues relating to gate height differences between logic gates and eNVM control gate/floating stacked gates. Such height differences are problematic for planarization processes used in RMG techniques. Also, high aspect ratios are encountered during the metal fill process of the RMG process. As a result, the devices are formed with metal gap fill problems.

Accordingly, it is desirable to provide simpler and more efficient eNVM and RMG compatible integration schemes and enabling methodology. Also, it is desirable to provide methods for fabricating devices in which differences in gate heights during RMG processing and high aspect ratio filling processes are avoided. Further, it is desirable to provide methods for fabricating devices in which floating gates and metal gates are formed before control gates are formed over the floating gates. Also, it is desirable to provide devices in which the width of the control gate is not limited to the width of the floating gate. Furthermore, other desirable features and characteristics will become apparent from the subsequent detailed description and the appended claims, taken in conjunction with the accompanying drawings and this background.

BRIEF SUMMARY

Devices including eNVM and metal gates and methods for fabricating such devices are provided. In an embodiment, a method for fabricating a device includes providing a semiconductor substrate. The method includes forming a floating gate and a sacrificial gate over the semiconductor substrate. The method replaces the sacrificial gate with a metal gate. After replacing the sacrificial gate with the metal gate, the method forms a control gate over the floating gate.

In another exemplary embodiment, a method for fabricating an integrated circuit device is provided and includes forming a floating gate and a sacrificial logic gate over a semiconductor substrate. The method includes depositing a dielectric layer over the semiconductor substrate. Further, the method includes removing the sacrificial logic gate to form a logic gate trench in the dielectric layer. Also, the method includes forming a metal logic gate in the logic gate trench.

In yet another exemplary embodiment, a device is provided and includes a logic cell formed with a metal gate having a top surface at a first height over a semiconductor substrate. The device also includes a memory cell formed with a floating gate and with a control gate overlying the floating gate. The floating gate has a top surface at a second height over the semiconductor substrate, and the second height is no greater than the first height.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the integrated circuit devices or methods for fabricating integrated circuit devices with floating gates and replacement metal gates. Furthermore, there is no intention to be bound by any expressed or implied theory presented in the preceding technical field, background or brief summary, or in the following detailed description.

For the sake of brevity, conventional techniques related to integrated circuit device fabrication may not be described in detail herein. Moreover, the various tasks and processes described herein may be incorporated into a more comprehensive procedure or process having additional steps or functionality not described in detail herein. In particular, various steps in the fabrication of integrated circuits are well-known and so, in the interest of brevity, many conventional steps will only be mentioned briefly herein or will be omitted entirely without providing the well-known process details.

As used herein, it will be understood that when an element or layer is referred to as being "over" another element or layer, it may be directly on the other element or layer, or intervening elements or layers may be present. When an element or layer is referred to as being "on" another element or layer, it is directly on and in contact with the other element or layer. Further, spatially relative terms, such as "above", "lower", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass either an orientation of above or below. The device may be otherwise oriented (rotated 90 degrees or at other orientations) and the spatially relative descriptors used herein may likewise be interpreted accordingly.

Figure 1:
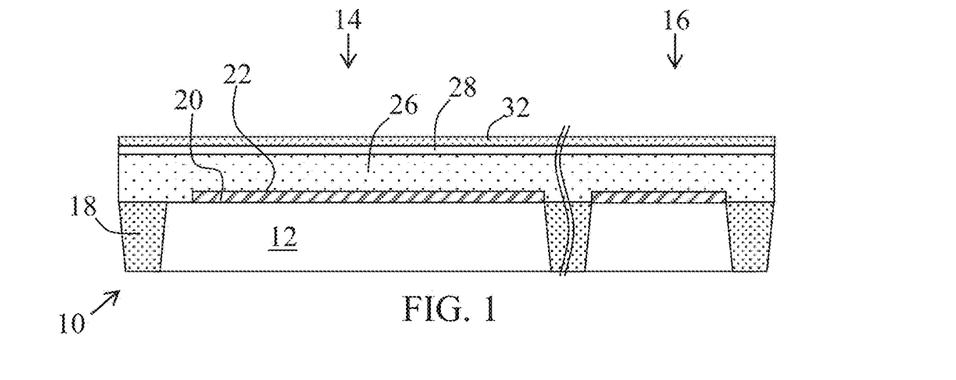
FIGS. 1-3 illustrate exemplary processing for forming gates, including polysilicon floating gates and polysilicon sacrificial gates in accordance with an embodiment.
Figure 2:
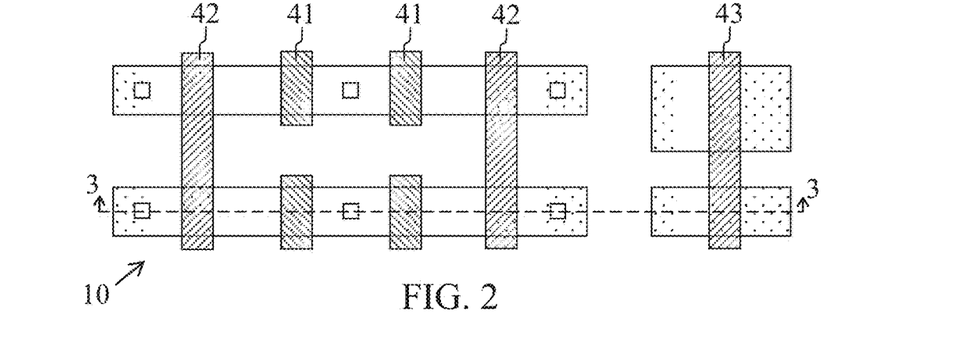
Figure 3:
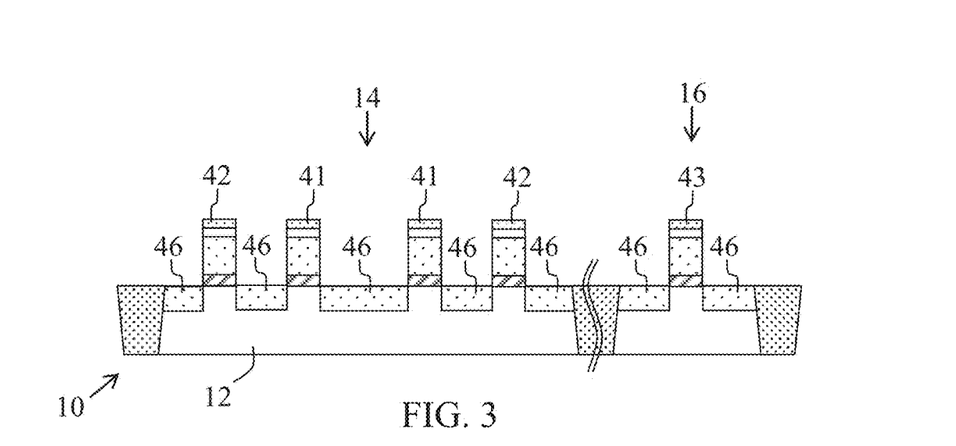
Figure 8:
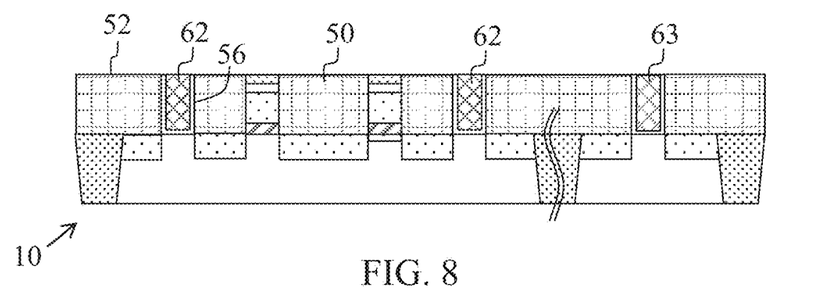
FIG. 8 illustrates exemplary processing for forming metal gates in the trenches of FIGS. 4-7 using RMG techniques in accordance with an embodiment.
Figure 9:
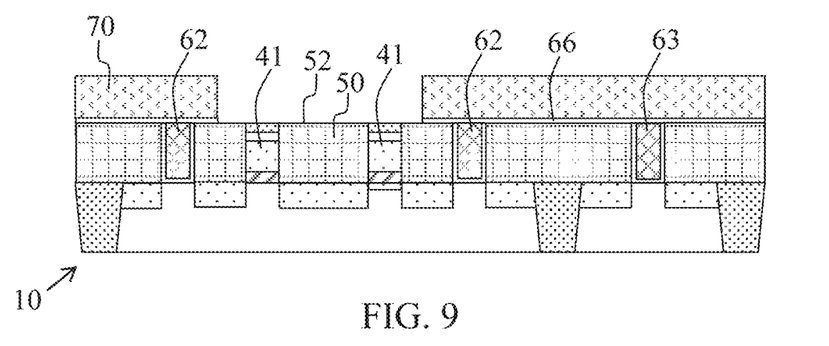
FIG. 9 illustrates exemplary processing for preparing the device of FIG. 8 for control gate formation in accordance with an embodiment.

In accordance with the various embodiments herein, integrated circuit devices and methods for fabricating integrated circuit devices including embedded non-volatile memory (eNVM) and metal gates formed by replacement metal gate (RMG) techniques. The Figures illustrate exemplary embodiments for fabricating devices with eNVM and metal gates formed by RMG techniques. FIGS. 1-3 illustrate exemplary processing for forming gates, including floating gates and sacrificial gates. FIGS. 4-7 illustrate exemplary processing for removing the sacrificial gates of FIGS. 1-3 to form trenches. FIG. 8 illustrates exemplary processing for forming metal gates in the trenches of FIGS. 4-7 using RMG techniques. FIG. 9 illustrates exemplary processing of the partially fabricated device of FIGS. 4-7 for preparing for control gate formation. FIGS. 10-15 illustrate an embodiment for forming control gates overlying the floating gates of the structure of FIG. 9. FIGS. 16-20 illustrate another embodiment for forming control gates overlying the floating gates of the structure of FIG. 9.

As illustrated in FIG. 1, in accordance with an exemplary embodiment herein, the fabrication of a device 10 includes providing a semiconductor substrate 12 in and/or on which such devices are fabricated. As used herein, the term "semiconductor substrate" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In an exemplary embodiment, the semiconductor material is a silicon substrate, such as crystalline silicon. The silicon substrate may be a bulk silicon wafer or may be a thin layer of silicon (on an insulating layer commonly known as silicon-on-insulator or SOI) that, in turn, is supported by a carrier wafer. As referred to herein, a material that includes a recited element/compound includes the recited element/compound in an amount of at least 10 weight percent based on the total weight of the material unless otherwise indicated.

The semiconductor substrate 12 includes memory cell regions 14 where memory cell devices are formed. Further, the semiconductor substrate 12 includes logic cell regions 16 where logic cells are formed. Isolation regions 18 may be formed in the semiconductor substrate 12. Exemplary isolation regions 18 are formed by conventional shallow trench isolation (STI) techniques. Either before or after fabrication of isolation regions 18, selected portions of the semiconductor substrate 12 can be impurity doped, for example by ion implantation. For example, wells can be doped with N-type impurities or with P-type impurities for the fabrication of devices 10. Isolation regions 18 may separate memory cell regions 14 from logic cell regions 16 or may be formed within memory cells regions 14 or within logic cell regions 16. As shown, the semiconductor substrate 12 and isolation regions 18 form an upper surface 20.

In an exemplary embodiment, a layer of gate insulator 22 is formed on the surface 20 of the semiconductor substrate 12. The gate insulator 22 may be thermally grown silicon oxide formed by heating the semiconductor substrate 12 in an oxidizing ambient, or may be a deposited insulator such as a silicon oxide or a high dielectric constant insulator such as hafnium silicon oxide, or the like. Deposited insulators can be deposited in a known manner, for example, by chemical vapor deposition (CVD), low pressure chemical vapor deposition (LPCVD), semi-atmospheric chemical vapor deposition (SACVD), or plasma enhanced chemical vapor deposition (PECVD). Gate insulator 22 is illustrated as a thermally grown silicon dioxide layer. The gate insulator 22 may be from about 1 to about 10 nm in thickness. For use in a floating gate, the gate insulator 22 may be considered to be tunnel oxide.

In accordance with one embodiment, a layer of gate electrode material 26, such as polycrystalline silicon, is deposited onto the layer of gate insulator 22. The gate electrode material 26 may be hereinafter referred to as polycrystalline silicon although those of skill in the art will recognize that other materials can be employed. If the gate electrode material 26 is polycrystalline silicon, that material is typically deposited to a thickness of from about 50 to about 200 nm. In an exemplary embodiment, the polycrystalline silicon is deposited to a thickness of about 100 nm by LPCVD through the hydrogen reduction of silane. In an exemplary embodiment, the layer of polycrystalline silicon is deposited as undoped polycrystalline silicon and is subsequently impurity doped by ion implantation.

As shown, an inter-gate dielectric layer 28 is formed on the gate electrode material 26. An exemplary dielectric layer 28 is an oxide-nitride-oxide (ONO) film, though another high k dielectric, for example hafnium oxide ($HfO_2$) or (ISSG), may be used. An ONO film may be formed by depositing a first layer of silicon dioxide, depositing a layer of silicon nitride on top of the silicon dioxide, and forming a second layer of silicon dioxide on the nitride layer. The second oxide layer is typically grown in a thermal oxidation process, such as a steam oxidation, of the nitride layer.

In FIG. 1, a layer of gate electrode material 32 is formed on the inter-gate dielectric layer 28. The gate electrode material 32 may be used as a portion of a control gate electrode, may be sacrificial, or may be used as a masking layer. An exemplary gate electrode material 32 is polycrystalline silicon, though other suitable materials may be used. The gate electrode material 32 may be formed by LPCVD through the hydrogen reduction of silane. In an exemplary embodiment, the gate electrode material 32 is formed with a thickness of from about 5 to about 40 nm, such as about 10 nm.

FIGS. 2 and 3 illustrate further processing of device 10. FIG. 2 is a schematic overhead view while FIG. 3 is a cross section view similar to FIG. 1 and taken along line 3-3 in FIG. 2. As shown, the layers formed over the semiconductor substrate 12 in FIG. 1 are patterned and etched to form gates. For example, the etch process may form floating gates 41 and sacrificial select gates 42 over the memory cell region 14 and sacrificial logic gates 43 (or sacrificial access gates) over the logic cell region 16. In an exemplary embodiment, a same mask is formed and patterned to provide for simultaneous etching of the layers overlying the semiconductor substrate 12 to form the floating gates 41, select gates 42, and logic gates 43. Etching can be accomplished by, for example, plasma etching. After the gate etch and mask removal, doping processes such as ion implantation processes may be performed to form various source/drain regions 46 in the semiconductor substrate 12.

Figure 4:
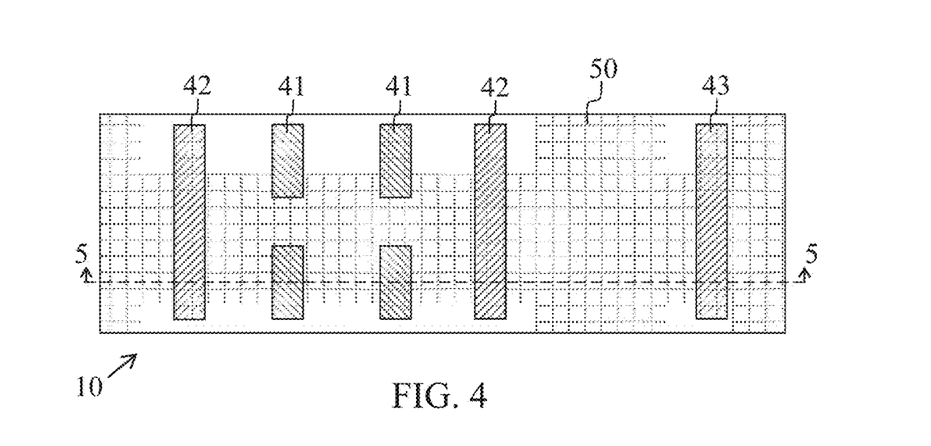
FIGS. 4-7 illustrate exemplary processing for removing the sacrificial gates of FIGS. 1-3 to form trenches in accordance with an embodiment.
Figure 5:
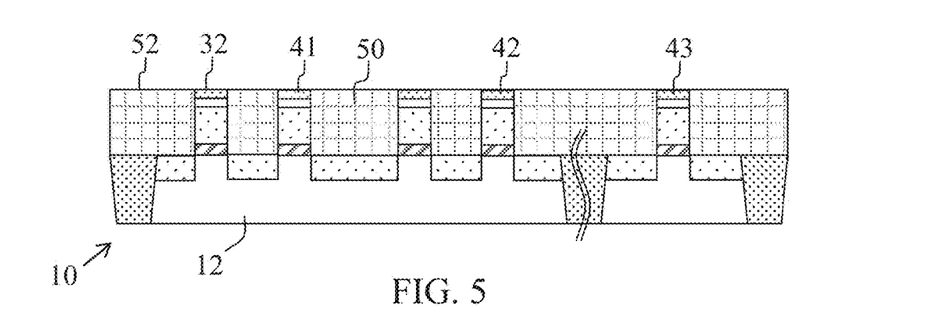

FIGS. 4 and 5 illustrate further processing of device 10. FIG. 4 is a schematic overhead view while FIG. 5 is a cross section view similar to FIGS. 1 and 3 and taken along line 5-5 in FIG. 4. As shown, an interlayer dielectric 50 is deposited over the semiconductor substrate 12 and gates 41, 42 and 43. Further, the interlayer dielectric 50 is planarized, such as by chemical mechanical planarization (CMP) to establish a surface 52 formed by the interlayer dielectric 50 and the gate electrode material 32 in the gates 41, 42 and 43.

Figure 6:
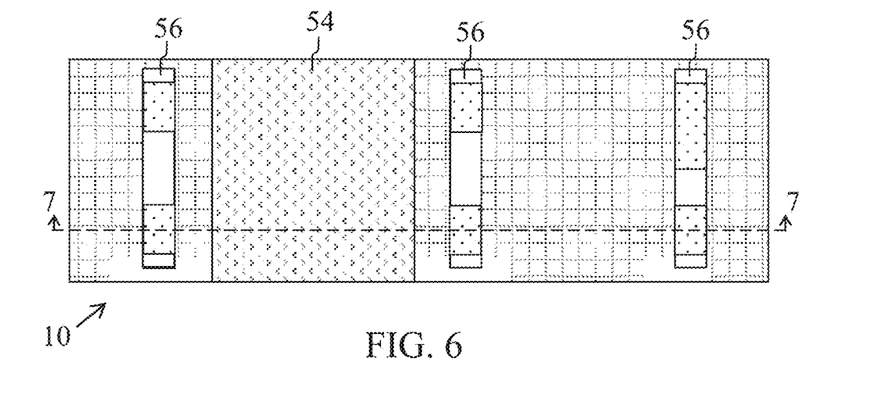
Figure 7:
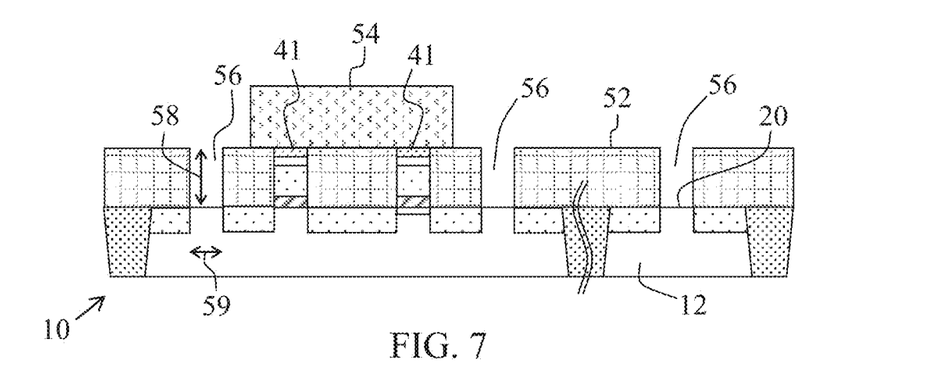

The exemplary method may continue as shown in FIGS. 6 and 7. FIG. 6 is a schematic overhead view while FIG. 7 is a cross section view similar to FIGS. 1, 3, and 5 and taken along line 7-7 in FIG. 6. As shown, a mask 54 such as photoresist is deposited onto the surface 52 and patterned to cover or block the non-sacrificial gates, i.e., the floating gates 41, while exposing the sacrificial gates 42 and 43 (shown in FIGS. 4-5). Then, the gate electrode material 32, inter-gate dielectric layer 28, and gate electrode material 26 of the sacrificial gates 42 and 43 are removed. For example, selective etches may be performed to remove the gate electrode material 32, inter-gate dielectric layer 28, and gate electrode material 26. As a result, trenches 56 are formed in the interlayer dielectric 50. In an exemplary embodiment, the trenches 56 are formed with a depth, measured from the surface 52 to the surface 20 and indicated by double-headed arrow 58, of from about 60 to about 80 nm, and a width, indicated by double-headed arrow 59 of from about 20 to about 2000 nm. In certain embodiments, the width 59 of the trenches 56 is correlated to the gate length, such that the minimum/maximum trench width 59 is the minimum/maximum allowed gate length.

In FIG. 8, the mask 54 is removed and a replacement metal gate (RMG) process is performed to form metal select gates 62 and metal logic gates 63 (or metal access gates). A conventional RMG process may performed, such as deposition of a barrier layer or layers within trenches 56, deposition of high-k dielectric material within trenches 56, deposition of metal fill or fills within trenches 56, and planarization to surface 52 to remove materials outside of trenches 56. Because the depth 58 of the trenches 56 is equal to the height of the floating gate (and is less than the height of a stacked control gate/floating gate), the aspect ratio of the trenches 56 does not lead to improper metal fill and gap formation during the RMG process.

FIG. 9 illustrates processing of the partially fabricated device 10 after formation of the metal gates 62 and 63. In FIG. 9, a hard mask 66 is deposited over the surface 52 formed by the interlayer dielectric 50, floating gates 41, metal select gates 62 and metal logic gates 63. An exemplary hard mask 66 is a layer of silicon nitride. In an exemplary embodiment, the hard mask 66 is deposited by PECVD to a thickness of from about 30 to about 50 nm from the reaction of dichlorosilane and ammonia. Dielectric materials other than silicon nitride can be deposited as the hard mask 66. In an exemplary embodiment, the hard mask 66 serves to protect the metal gates 62 and 63 during later processing.

As shown in FIG. 9, further processing involves removal of the hard mask 66 lying over the floating gates 41. A mask 70, such as a photoresist, is formed and patterned to cover the metal gates 62 and 63 and to expose the hard mask 66 overlying the floating gates 41. The hard mask 66 exposed by the mask 70 is then removed, such as by a wet etch process.

Figure 10:
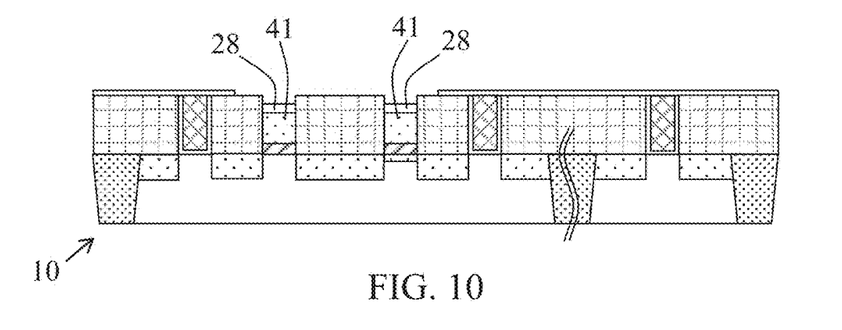
FIGS. 10-15 illustrate an embodiment for forming control gates overlying the floating gates of the structure of FIG. 9.

FIGS. 10-15 illustrate an embodiment for further processing of the partially fabricated device 10 of FIG. 9 to form control gates overlying the floating gates 41. In FIG. 10, the mask 70 is removed. The gate electrode material 32 is then removed from the floating gates 41. For example, a wet etch process may be performed to selectively remove the gate electrode material 32. As a result, the inter-gate dielectric layer 28 of the floating gates 41 is exposed.

Figure 11:
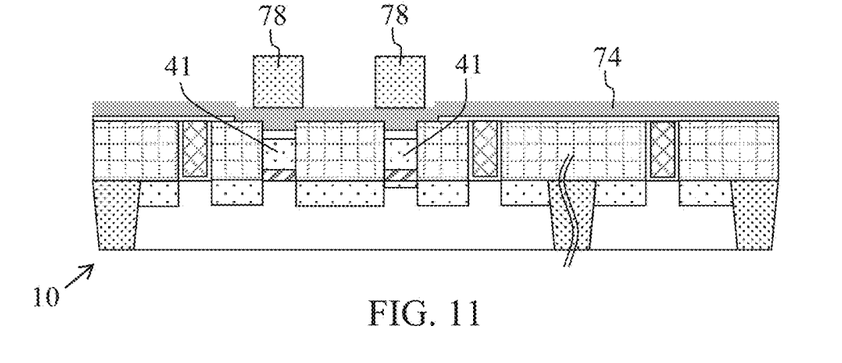

In FIG. 11, a gate electrode material 74 is deposited over the partially fabricated device 10. An exemplary gate electrode material 74 is polycrystalline silicon, though other materials can be employed. The exemplary gate electrode material 74 may be deposited to a thickness of from about 50 to about 200 nm. In an exemplary embodiment, polycrystalline silicon is deposited to a thickness of about 100 nm by LPCVD. In an exemplary embodiment, the layer of polycrystalline silicon is deposited using an in situ doping process. As shown, a mask 78, such as photoresist, is formed over the gate electrode material 74 and is patterned to cover the floating gates 41.

Figure 12:
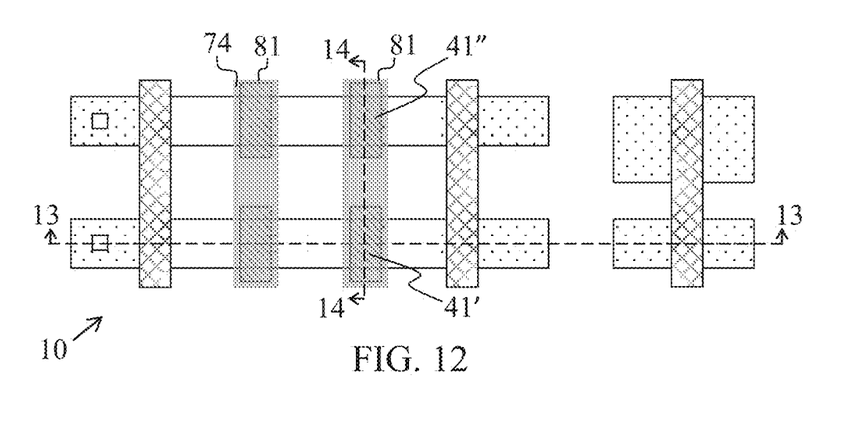
Figure 13:
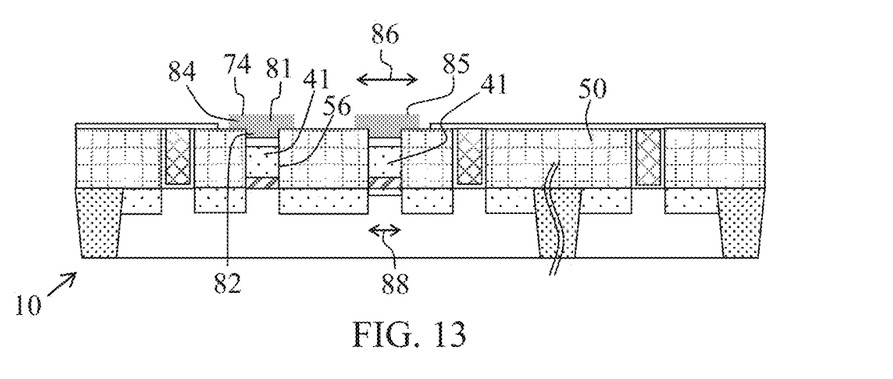
Figure 14:
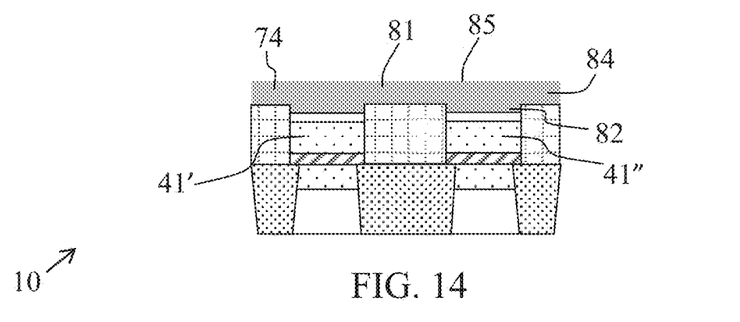

In FIGS. 12-14, the partially fabricated device 10 of FIG. 13 is further processed to form control gates 81. FIG. 12 is a schematic overhead view, FIG. 13 is a cross section view similar to FIG. 11 and taken along line 13-13 in FIG. 12, and FIG. 14 is a cross section view taken along line 14-14 in FIG. 12. In FIG. 12-14, the gate electrode material 74 is etched to form control gates 81 overlying the floating gates 41. In an exemplary embodiment, the etch is performed by a dry etch process. The mask 78 is then removed.

As shown in FIG. 13, the control gates 81 are formed with a lower portion 82 formed within the trenches 56 and an upper portion 84 positioned over the lower portions 82 and over the interlayer dielectric 50. The control gates 81 terminate at an upper surface 85. The upper portion 84 of each control gate 81 has a width indicated by double headed arrow 86 that is greater than the width, indicated by double headed arrow 88, of each floating gate 41. In the exemplary process described herein, the width 86 of each control gate 81 is not limited to the width 88 of each floating gate 41. Further, as shown in FIGS. 12 and 14, the gate electrode material 74 extends from laterally adjacent floating gates 41' and 41" to serve as a common upper portion 84 of the control gates 81.

Figure 15:
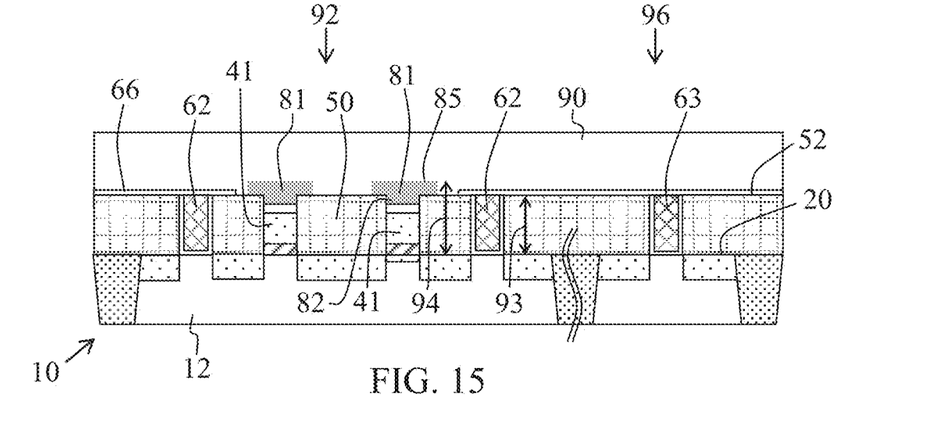

The exemplary method continues in FIG. 15 with the deposition of an interlayer dielectric material 90 over the control gates 81, hard mask 66, and interlayer dielectric 50.

Thereafter, further processing such as contact formation and metallization may be performed.

Figure 16:
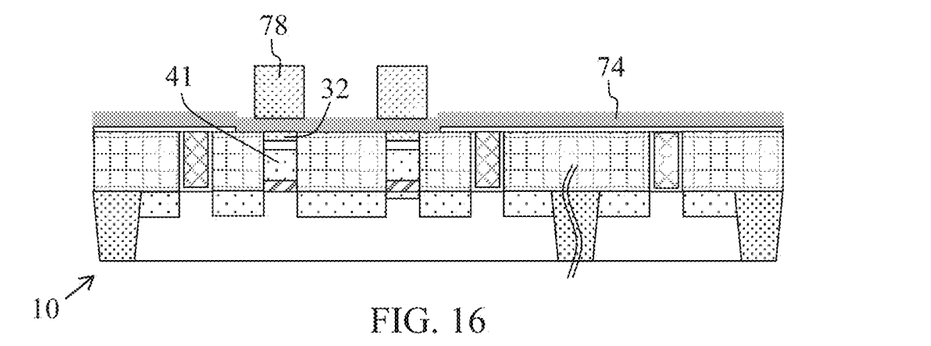
FIGS. 16-20 illustrate another embodiment for forming control gates overlying the floating gates of the structure of FIG. 9.

FIGS. 16-20 illustrate another embodiment for the processing of the partially fabricated device 10 of FIG. 9 to form control gates 81. In FIG. 16, the mask 70 from FIG. 9 is removed. Unlike the embodiment of FIGS. 10-15, the gate electrode material 32 is not removed from the floating gates 41. Rather, as shown in FIG. 16, the gate electrode material 74 is deposited over the gate electrode material 32 and the rest of the partially fabricated device 10. As recited above, an exemplary gate electrode material 74 is polycrystalline silicon, though other materials can be employed. The exemplary gate electrode material 74 may be deposited to a thickness of from about 50 to about 200 nm. In an exemplary embodiment, polycrystalline silicon is deposited to a thickness of about 100 nm by LPCVD. In an exemplary embodiment, the layer of polycrystalline silicon is deposited using an in situ doping process. As shown, a mask 78, such as photoresist, is formed over the gate electrode material 74 and is patterned to cover the floating gates 41.

Figure 17:
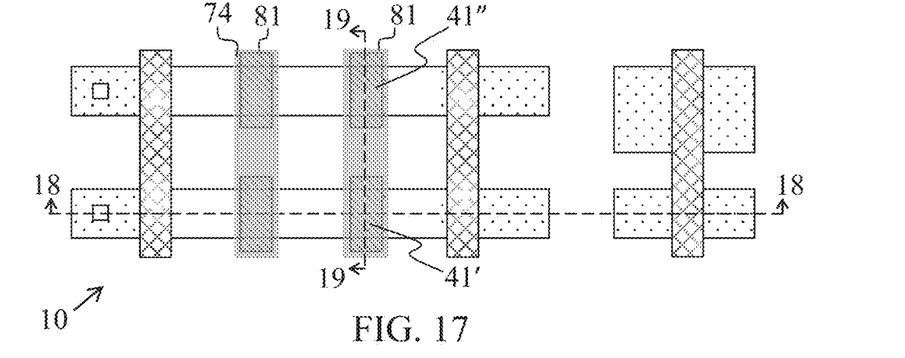
Figure 18:
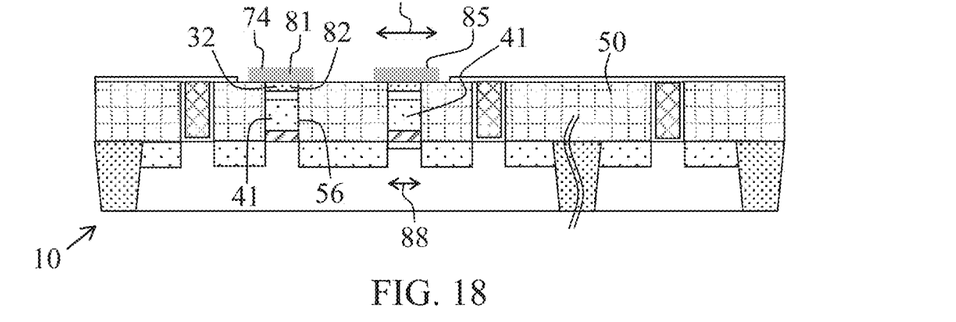
Figure 19:
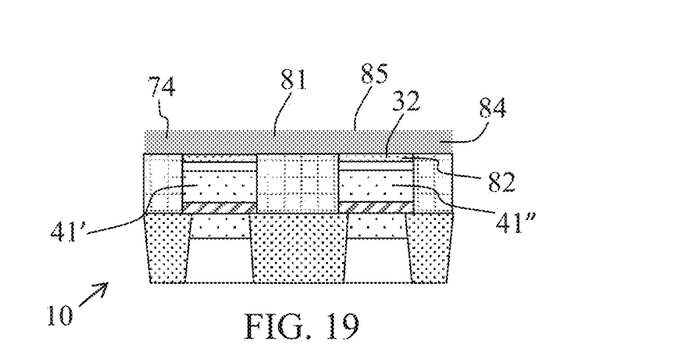

In FIGS. 17-19, the partially fabricated device 10 of FIG. 16 is further processed to form control gates 81. FIG. 17 is a schematic overhead view, FIG. 18 is a cross section view similar to FIG. 16 and taken along line 18-18 in FIG. 17, and FIG. 19 is a cross section view taken along line 19-19 in FIG. 17. In FIGS. 17-19, the gate electrode material 74 is etched to form control gates 81 overlying the floating gates 41. The mask 78 is then removed.

As shown in FIG. 18, the gate electrode material 32 forms the lower portion 82 of each control gate 81 within a respective trench 56. Further, the gate electrode material 74 forms the upper portion 84 positioned over the lower portions 82 and the interlayer dielectric 50. The control gates 81 terminate at an upper surface 85. The upper portion 84 of each control gate 81 has a width indicated by double headed arrow 86 that is greater than the width, indicated by double headed arrow 88, of each floating gate 41. In the exemplary process described herein, the width 86 of each control gate 81 is not limited to the width 88 of each floating gate 41. Further, as shown in FIGS. 17 and 19, the gate electrode material 74 extends from laterally adjacent floating gates 41' and 41" to serve as a common upper portion 84 of the control gates 81.

Figure 20:
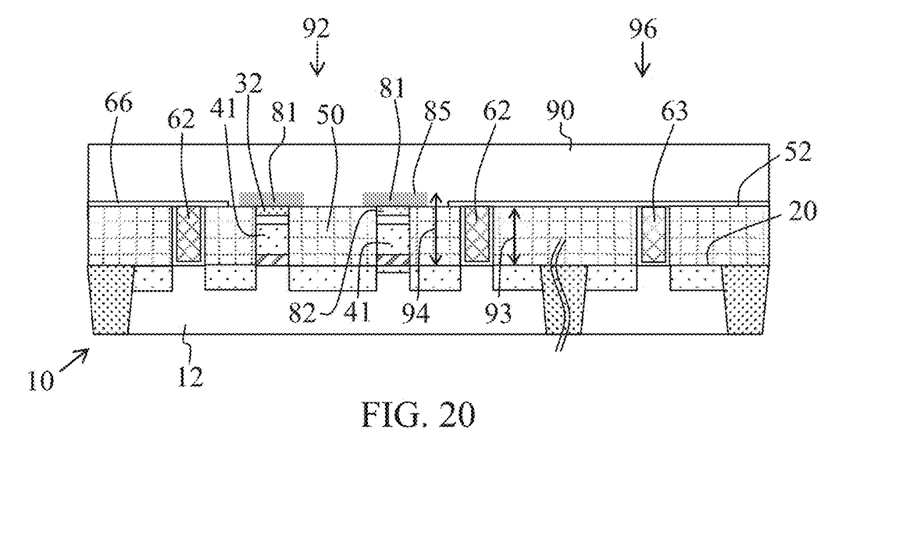

The exemplary method continues in FIG. 20 with the deposition of an interlayer dielectric material 90 over the control gates 81, hard mask 66, and interlayer dielectric 50. Thereafter, further processing such as contact formation and metallization may be performed.

The devices 10 shown in FIGS. 15 and 20 include memory cells 92 including control gates 81 stacked over floating gates 41, such as polysilicon control gates 81 stacked over polysilicon floating gates 41. Further, the memory cells 92 include metal select gates 62 formed by a RMG process. The metal select gates 62 have a height, measured from the surface 52 to the surface 20 and indicated by double headed arrow 93, less than the height of the stacked control gate/floating gates, measured from the surface 85 to the surface 20 and indicated by double headed arrow 94. Specifically, the height 93 of the metal select gates 62 is equal to the height of the floating gate 41 plus the lower portion 82 of the control gate 81. As shown in FIGS. 15 and 20, the devices 10 include logic cells 96 including metal logic gates 63 formed by a RMG process. The metal logic gates 63 have a height equal to the height 93 of the metal select gates 62, less than the height 94 of the stacked control gate/floating gates, and equal to the height of the floating gate 41 plus the lower portion 82 of the control gate 81.

In an exemplary embodiment, the methods described herein form floating gates and sacrificial gates before replacing the sacrificial gates with metal gates. After replacing the sacrificial gates with metal gates, the described methods form control gates over the floating gates. In this manner, the height of the metal gates is independent of the height of the control gate/floating gate stacks.

In an exemplary embodiment, the methods described herein avoid metal fill issues that result from high aspect ratio filling involved in conventional processing. Further, the methods described herein avoid issues encountered during planarization techniques in RMG processing when integrated with eNVM cells. Further, the methods described herein may eliminate use of at least one mask during the fabrication processing flow as compared to conventional processing.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A method for fabricating a device, the method comprising:
    providing a semiconductor substrate;
    forming a floating gate with a first width and a sacrificial gate over the semiconductor substrate;
    replacing the sacrificial gate with a metal gate; and
    after replacing the sacrificial gate with the metal gate, forming a control gate with a second width greater than the first width over the floating gate.

2. The method of claim 1 wherein forming the control gate over the floating gate comprises:
    depositing a control gate layer over the semiconductor substrate, wherein a selected portion of the control gate layer is overlying the floating gate;
    masking the selected portion of the control gate layer; and
    etching an unmasked portion of the control gate layer to form the control gate.

3. The method of claim 1 wherein:
    forming the floating gate and the sacrificial gate over the semiconductor substrate comprises forming a sacrificial select gate and a sacrificial logic gate over the semiconductor substrate;
    replacing the sacrificial gate with the metal gate comprises replacing the sacrificial select gate with a metal select gate and replacing the sacrificial logic gate with a metal logic gate; and
    the method includes forming the control gate over the floating gate after replacing the sacrificial select gate with the metal select gate and replacing the sacrificial logic gate with the metal logic gate.

4. The method of claim 1 wherein forming the floating gate and the sacrificial gate comprises:
    depositing a floating gate layer over the semiconductor substrate;
    depositing an inter-gate layer over the floating gate layer;
    depositing a masking layer over the inter-gate layer; and etching the masking layer, the inter-gate layer, and the floating gate layer to form the floating gate and the sacrificial gate.

5. The method of claim 4 further comprising;
depositing a dielectric layer over the semiconductor substrate; and
planarizing the dielectric layer to the masking layer, wherein replacing the sacrificial gate with the metal gate comprises:
removing the sacrificial gate to form a trench in the dielectric layer;
depositing metal gate layers in the trench; and
removing the metal gate layers outside of the trench.

6. The method of claim 1 wherein forming the floating gate and the sacrificial gate over the semiconductor substrate comprises forming the floating gate over a memory cell region of the semiconductor substrate and forming a sacrificial logic gate over a logic cell region of the semiconductor substrate.

7. The method of claim 1 wherein forming the floating gate and the sacrificial gate over the semiconductor substrate comprises forming the floating gate over a memory cell region of the semiconductor substrate and forming a sacrificial select gate over the memory cell region of the semiconductor substrate.

8. The method of claim 1 wherein forming the floating gate and the sacrificial gate over the semiconductor substrate comprises forming the floating gate over a memory cell region of the semiconductor substrate, forming a sacrificial select gate over the memory cell region of the semiconductor substrate, and forming a sacrificial logic gate over a logic area of the semiconductor substrate.

9. A method for fabricating an integrated circuit device, the method comprising:
depositing a floating gate electrode material over a semiconductor substrate;
depositing a lower control gate electrode material over the floating gate electrode material;
etching the floating gate electrode material and the lower control gate electrode material to form a floating gate and a sacrificial logic gate over the semiconductor substrate;
depositing a dielectric layer over the semiconductor substrate;
removing the floating gate electrode material and the lower control gate electrode material forming the sacrificial logic gate to form a logic gate trench in the dielectric layer; and
forming a metal logic gate in the logic gate trench.

10. The method of claim 9 further comprising depositing an upper control gate electrode material over the lower control gate electrode material to form a control gate over the floating gate after forming the metal logic gate in the logic gate trench.

11. The method of claim 9 wherein forming the floating gate and the sacrificial logic gate further comprises forming a sacrificial select gate over the semiconductor substrate, and wherein the method further comprises:
removing the sacrificial select gate to form a select gate trench in the dielectric layer; and
forming a metal select gate in the select gate trench.

12. The method of claim 9 wherein forming the floating gate and the sacrificial logic gate over the semiconductor substrate comprises:
depositing a tunnel layer over the semiconductor substrate;
depositing the floating gate electrode material over the tunnel layer;
depositing an inter-gate layer over the floating gate electrode material;
depositing the lower control gate electrode material over the inter-gate layer; and
etching the lower control gate electrode material, the inter-gate layer, the floating gate electrode material and the tunnel layer to form the floating gate and the sacrificial logic gate.

13. The method of claim 12 further comprising planarizing the dielectric layer and the lower control gate electrode material in the floating gate and in the sacrificial logic gate and masking the floating gate before removing the sacrificial logic gate.

14. The method of claim 9 further comprising:
forming a hard mask over the metal logic gate;
depositing an upper control gate electrode material over the semiconductor substrate, on the hard mask, and on the lower control gate electrode material of the floating gate; and
etching the upper control gate electrode material to form a control gate over the floating gate.

15. The method of claim 1
wherein forming the floating gate comprises:
depositing a floating gate electrode material over the semiconductor substrate;
depositing an inter-gate layer over the floating gate electrode material;
depositing a masking layer over the inter-gate layer; and
etching the masking layer, the inter-gate layer, and the floating gate electrode material to form the floating gate and the sacrificial logic gate;
wherein the method further comprises:
forming a hard mask over the metal gate; and
removing the masking layer from the floating gate; and
wherein forming the control gate comprises:
depositing a control gate layer over the semiconductor substrate and on the inter-gate layer of the floating gate; and
etching the control gate layer to form the control gate over the floating gate.

16. The method of claim 9 further comprising:
depositing a control gate layer over the semiconductor substrate; and
etching the control gate layer to form a control gate over the floating gate, wherein the floating gate has a first width, and wherein the control gate has a second width greater than the first width.

17. A device comprising:
a logic cell formed with a metal gate having a top surface at a first height over a semiconductor substrate; and
a memory cell formed with a floating gate and with a control gate overlying the floating gate, wherein the floating gate has a first width, and wherein the control gate has a second width, wherein the floating gate has a top surface at a second height over the semiconductor substrate, wherein the second height is no greater than the first height, and wherein the control gate has a top surface at a third height over the semiconductor substrate; and
wherein the second width is greater than the first width and/or the third height is greater than the first height.

18. The device of claim 17 wherein the second width is greater than the first width.

19. The device of claim 17 wherein the third height is greater than the first height.

20. The device of claim 17 wherein the metal gate has a third width equal to the first width.

* * * * *